(12) United States Patent  
Gan

(10) Patent No.: US 9,117,819 B2  
(45) Date of Patent: Aug. 25, 2015

(54) ELECTROSTATIC DISCHARGE PROTECTION STRUCTURE AND METHOD FOR FORMING THE SAME

(71) Applicant: Semiconductor Manufacturing International (Shanghai) Corporation, Shanghai (CN)

(72) Inventor: Zhenghao Gan, Shanghai (CN)

(73) Assignee: Semiconductor Manufacturing International (Shanghai) Corporation, Shanghai (CN)

(*) Notice: Subject to any disclaimer, the term of this patent is extended or adjusted under 35 U.S.C. 154(b) by 13 days.

(21) Appl. No.: 14/057,169

(22) Filed: Oct. 18, 2013

(65) Prior Publication Data

US 2014/0361400 A1 Dec. 11, 2014

(30) Foreign Application Priority Data

Jun. 5, 2013 (CN) .......................... 2013 1 0224057

(51) Int. Cl.
| | | |
|---|---|---|
| *H01L 23/525* | (2006.01) | |
| *H01L 21/768* | (2006.01) | |
| *H01L 23/48* | (2006.01) | |
| *H01L 27/02* | (2006.01) | |

(52) U.S. Cl.  
CPC ...... *H01L 23/5252* (2013.01); *H01L 21/76822* (2013.01); *H01L 23/481* (2013.01); *H01L 27/0288* (2013.01)

(58) Field of Classification Search  
CPC ..... H01L 21/441; H01L 21/467; H01L 21/44; H01L 21/4763; H01L 23/48; H01L 23/522; H01L 29/01; H01L 29/40; H01L 23/5252  
See application file for complete search history.

(56) References Cited

U.S. PATENT DOCUMENTS

| 2010/0178761 A1* | 7/2010 | Chen et al. ..................... 438/613 |
| 2011/0006428 A1* | 1/2011 | Lo et al. ........................ 257/751 |

OTHER PUBLICATIONS

Li Wang et al. "Dual-Direction Nanocrossbar Array ESD Protection Structures" IEEE Electron Device Letters, vol. 34, No. 1, Jan. 2013.

* cited by examiner

*Primary Examiner* — Fernando L Toledo  
*Assistant Examiner* — Lawrence-Linh T Nguyen  
(74) *Attorney, Agent, or Firm* — Anova Law Group, PLLC

(57) ABSTRACT

Various embodiments provide electrostatic discharge protection structures and methods for forming the same. An exemplary structure can include a semiconductor chip including a through hole. The structure can further include a through silicon via (TSV) structure disposed within the through hole and passing through the semiconductor chip. The TSV structure can have a first surface and a second surface. The structure can further include a tunneling dielectric layer disposed on the first surface of the TSV structure. The tunneling dielectric layer can have a surface area covering a top view surface area of the TSV structure and a surface portion of the semiconductor chip surrounding the TSV structure. Yet further, the structure can include a metal material discretely dispersed in the tunneling dielectric layer, a first electrode disposed on the tunneling dielectric layer, and a second electrode disposed on the second surface of the TSV structure.

17 Claims, 7 Drawing Sheets

ELECTROSTATIC DISCHARGE PROTECTION STRUCTURE AND METHOD FOR FORMING THE SAME

CROSS-REFERENCES TO RELATED APPLICATIONS

This application claims priority to Chinese Patent Application No. CN201310224057.5, filed on Jun. 5, 2013, the entire contents of which are incorporated herein by reference.

FIELD OF THE DISCLOSURE

The present disclosure relates to the field of electrostatic protection technology and, more particularly, relates to electrostatic discharge (ESD) protection structures and methods for forming the ESD protection structures.

BACKGROUND

With rapid development of semiconductor fabrication technology, in order to achieve faster computing speed, greater data storage capacity and more features, semiconductor chips are being developed toward a higher degree of integration. One of the developments is packaging using through silicon via (TSV) technology. That is, a TSV runs through an entire semiconductor substrate to form electrical conduction path between stacked chips, thus realizing electrical connections between different chips. In contrast with conventional wire bonding technology, packaging using the TSV technology can accomplish maximum density and minimum sizes for chips stacked in three-dimension directions, and can greatly improve chip speed and performance at low power consumption.

In existing technology, usually input/output (I/O) ports of an integrated circuit (IC) are electrically connected to electrostatic discharge (ESD) protection structures in order to protect the IC from being affected by electrostatic discharge. High voltages may be generated during an electrostatic discharge and may reach hundreds or even thousands of volts. In order to prevent the IC from being destroyed by burning, all of the ESD protection structures formed by existing technology take up a large chip area.

When using the wire bonding technology for packaging, an entire IC is located in an integral chip and only a limited number of I/O ports need to be electrically connected to the ESD protection structures. However, when using the TSV technology for packaging, an IC is divided and formed on different chips and the I/O ports of each stacked chip need to be electrically connected to the ESD protection structures. Thus, the chip area occupied by the ESD protection structures is multiplied.

At the same time, a material that fills the TSV is copper. When temperature changes, because copper and the semiconductor substrate have different coefficients of thermal expansion, the TSV tends to generate stress in the surrounding semiconductor substrate. As a result, electrical parameters of semiconductor devices formed around the TSV can change and be difficult to control. Therefore, isolation regions need to be formed around the TSV, and there should not be semiconductor devices formed in the isolation regions. Because the isolation regions can also take up a large portion of the chip area, overall area utilization of the chip is not satisfied.

BRIEF SUMMARY OF THE DISCLOSURE

One aspect of the present disclosure includes an electrostatic discharge (ESD) protection structure. An exemplary structure can include a semiconductor chip. The semiconductor chip can include a first surface adjacent to a semiconductor device disposed within the semiconductor chip, and a second surface opposite to the first surface. The semiconductor chip can also include a through hole. The structure can further include a through silicon via (TSV) structure disposed within the through hole and passing through the semiconductor chip. The TSV structure can have a first surface and a second surface. The structure can further include a tunneling dielectric layer disposed on the first surface of the TSV structure. The tunneling dielectric layer can have a surface area covering a top view surface area of the TSV structure and a surface portion of the semiconductor chip surrounding the TSV structure. Yet further, the semiconductor chip can include a metal material discretely dispersed in the tunneling dielectric layer, a first electrode disposed on the tunneling dielectric layer, and a second electrode disposed on the second surface of the TSV structure.

Another aspect of the present disclosure includes a method for forming an ESD protection structure. An exemplary method can include providing a semiconductor chip. The semiconductor chip can include a semiconductor device disposed on a semiconductor substrate, and an interlayer dielectric layer disposed on the semiconductor device and the semiconductor substrate. The semiconductor chip can include a first surface of the interlayer dielectric layer adjacent to the semiconductor device, and a second surface of the semiconductor substrate opposite to the first surface. The method can further include forming an opening through the interlayer dielectric layer and into a thickness portion of the semiconductor substrate. A TSV structure can be formed in the opening. The TSV structure can contain a metal material. Further, the method can include performing a thinning process on the second surface of the semiconductor chip until the TSV structure is exposed. The TSV structure can have a first surface and a second surface. Further, the method can include forming a tunneling dielectric layer on the first surface of the TSV structure such that the tunneling dielectric layer has a surface area covering a top view surface area of the TSV structure and a surface portion of the semiconductor chip surrounding the TSV structure. Further, the method can include diffusing the metal material from the TSV structure into the tunneling dielectric layer using an annealing process such that the metal material is discretely dispersed in the tunneling dielectric layer. Still further, the method can include forming a first electrode on the tunneling dielectric layer and forming a second electrode on the second surface of the TSV structure.

Other aspects or embodiments of the present disclosure can be understood by those skilled in the art in light of the description, the claims, and the drawings of the present disclosure.

DETAILED DESCRIPTION

Figure 1:
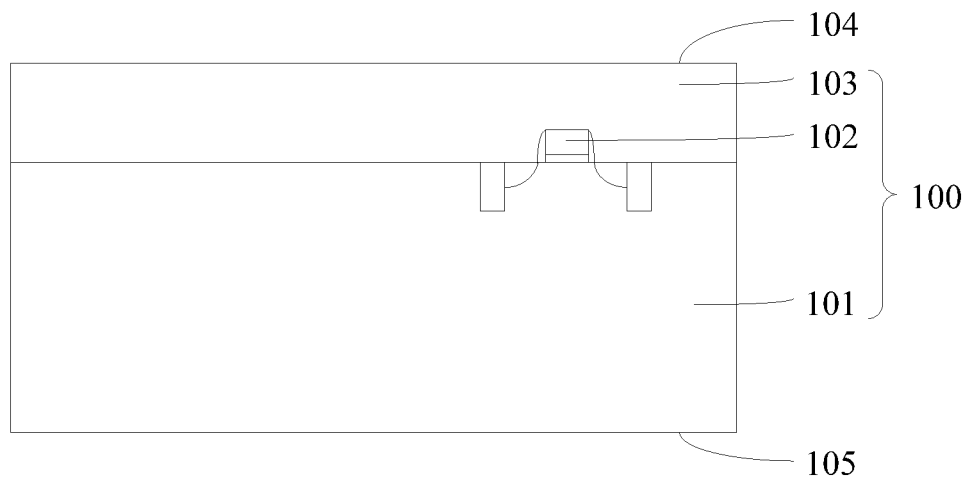
FIGS. 1-8 depict cross-sectional views of an exemplary ESD protection structure at various stages during its formation in accordance with various disclosed embodiments.

Reference will now be made in detail to exemplary embodiments of the disclosure, which are illustrated in the accompanying drawings. Wherever possible, the same reference numbers will be used throughout the drawings to refer to the same or like parts.

When using TSV technology for chip packaging, I/O ports of each stacked chip may need to be electrically connected to ESD protection structures. In addition, isolation regions may be formed near a TSV and semiconductor devices cannot be formed in the isolation regions. As a result, chip area utilization cannot be high enough.

Various embodiments provide an ESD protection structure and methods for forming the ESD protection structure. An exemplary ESD protection structure can include a semiconductor chip and a TSV structure that passes through the semiconductor chip. The TSV structure can include a first surface and a second surface.

The first surface can have a tunneling dielectric layer thereon. The tunneling dielectric layer can have a surface area larger than a top view surface area of the TSV structure, such that the tunneling dielectric layer can cover a portion of a surface of the semiconductor chip surrounding the TSV structure. A metal material can be discretely dispersed in the tunneling dielectric layer. The tunneling dielectric layer can have a first electrode thereon. The second surface of the TSV structure can have a second electrode thereon.

Because the TSV structure can be filled with the metal material, the metal material can diffuse into the tunneling dielectric layer through an annealing process. Meanwhile, because the tunneling dielectric layer is located on the first surface of the TSV structure and on the portion of the surface of the semiconductor substrate surrounding the TSV structure, i.e., in an isolation region, crystal lattice of the tunneling dielectric layer can be stretched under stress. This allows the metal material to be more easily diffused into the TSV structure to discretely disperse the metal material in the tunneling dielectric layer.

When an ESD has not occurred (e.g., when there is no ESD zap), the first electrode and the second electrode can be electrically isolated by the tunneling dielectric layer (i.e., OFF State). During an ESD (e.g., when there is an ESD zap), due to a high electrostatic voltage, a tunneling effect can occur between the metal materials discretely dispersed in the tunneling dielectric layer to electrically connect the first electrode with the second electrode, resulting in a low ON-state resistance (Ron). ESD (or ESD pulse) can occur through the TSV structure (i.e., ON state).

Because the TSV structure can have a large diameter, the ESD protection structure may not be burnt due to ESD. In addition, the ESD protection structure can be formed in the isolation region of the TSV structure to effectively use the area of the isolation region. Further, additional ESD protection structures may not need to be formed in other regions of the chip. The chip area utilization can then be improved.

Figure 12:
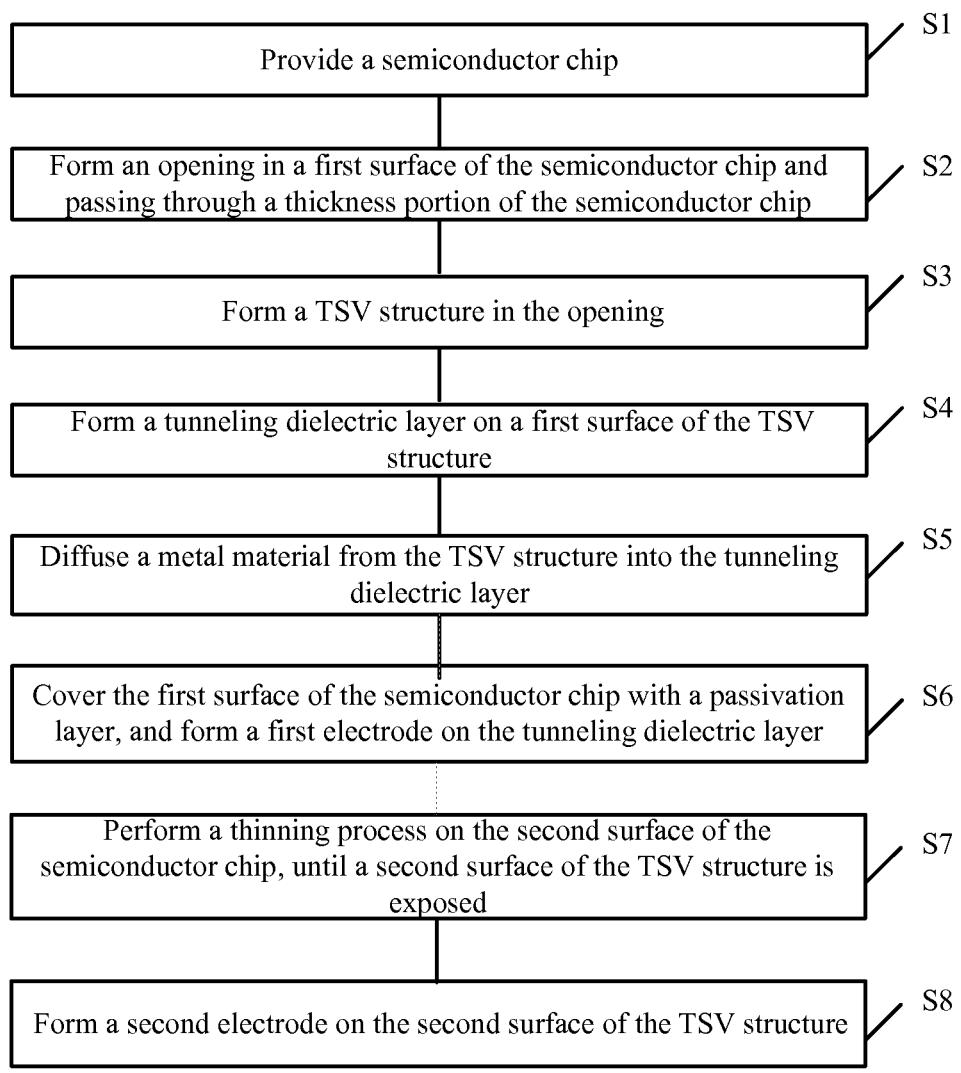
FIG. 12 depicts a flow diagram of an exemplary method for forming an ESD protection structure in accordance with various disclosed embodiments.

Various embodiments provide a method for forming an ESD protection structure. For example, FIG. 12 depicts a flow diagram of an exemplary method for forming an ESD protection structure in accordance with various disclosed embodiments. FIGS. 1-8 depict corresponding cross-sectional views of the ESD protection structure at various stages during its formation in accordance with various disclosed embodiments. Note that although FIGS. 1-8 depict structures corresponding to the method depicted in FIG. 12, the structures and the method are not limited to one another in any manner.

In Step S1 of FIG. 12 and referring to FIG. 1, a semiconductor chip 100 is provided. The semiconductor chip 100 has a first surface 104 and a second surface 105. The semiconductor chip 100 can also include, e.g., a semiconductor wafer. In one embodiment, one chip can be stacked with one or more chips to form an IC device.

The semiconductor chip 100 can include a semiconductor substrate 101, a semiconductor device 102 on a surface of the semiconductor substrate 101, and an interlayer dielectric layer 103 on the surface of the semiconductor substrate 101 and of the semiconductor device 102. Within the interlayer dielectric layer 103, there can be a metal interconnect structure (not shown) for electrically connecting to the semiconductor device 102. The first surface 104 of the semiconductor chip 100 can be a surface of the interlayer dielectric layer 103 on the semiconductor chip 100 having the semiconductor device 102. The second surface 105 of the semiconductor chip 100 can be a surface of the semiconductor substrate 101 that is opposite to the first surface 104.

As used herein, unless otherwise specified, the first surface 104 of the semiconductor chip 100 can be a surface formed adjacent to the semiconductor device 102 or adjacent to the interlayer dielectric layer 103 that contains the semiconductor device 102. The second surface 105 of the semiconductor chip 100 can be a surface of the semiconductor chip 100 that does not form the semiconductor device 102 and that is opposite to the first surface 104.

The semiconductor substrate 101 can include a silicon substrate, a germanium substrate, a germanium-silicon substrate (or silicon-germanium substrate), a silicon carbide substrate, and/or a silicon-on-insulator substrate. In one embodiment, the semiconductor substrate 101 can be a silicon substrate.

The semiconductor device 102 can be a device including, e.g., a metal-oxide-silicon (MOS) transistor, a resistor, a capacitor, etc. For illustration purposes, in one embodiment, the semiconductor device 102 (e.g., in FIG. 1) can be a MOS transistor. One semiconductor device 102 is depicted in FIG. 1. However, there can be one or more semiconductor devices 102, without limitation.

In one embodiment, a material that fills a TSV can be copper. Copper and the semiconductor chip 100 can have different coefficients of thermal expansion. When temperature changes, the TSV tends to generate stress in the surrounding semiconductor chip 100. As a result, electrical parameters of semiconductor devices around the TSV can be changed and be difficult to control.

Therefore, the semiconductor devices (e.g., the semiconductor device 102) may all be formed outside of an isolation region corresponding to the TSV structure, and may have a certain distance from the TSV structure, in order to prevent the stress generated by the TSV from causing offset in the electrical parameters of the semiconductor devices.

The interlayer dielectric layer 103 can be made of a material including, e.g., silicon oxide, silicon nitride, silicon oxynitride, and/or low-K dielectric material(s). In one embodiment, dielectric constant of the low-K dielectric material(s) can be less than about 3.9. The interlayer dielectric layer 103 can include a stacked layer.

Figure 2:
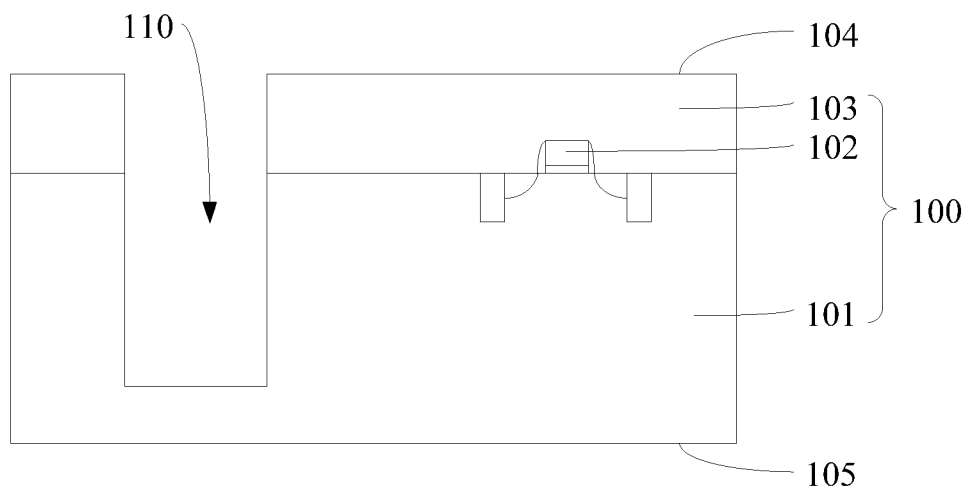

In Step S2 of FIG. 12 and referring to FIG. 2, an opening 110 is formed in the first surface 104 of the semiconductor chip 100. In various embodiments, the opening 110 can be used to subsequently form the TSV structure.

For example, a process of forming the opening 110 can include the following steps. First, a hard mask layer (not shown) is formed on the first surface 104 of the semiconductor chip 100. A patterned photoresist layer is then formed on the hard mask layer. Next, using the patterned photoresist layer as an etch mask, the hard mask layer and the semiconductor chip 100 are etched to form the opening 110. In one embodiment, the opening 110 can pass through the interlayer dielectric layer 103 and into a thickness portion of the semiconductor substrate 101. That is, the opening 110 can pass through at least a thickness portion of the semiconductor chip 100.

Figure 3:
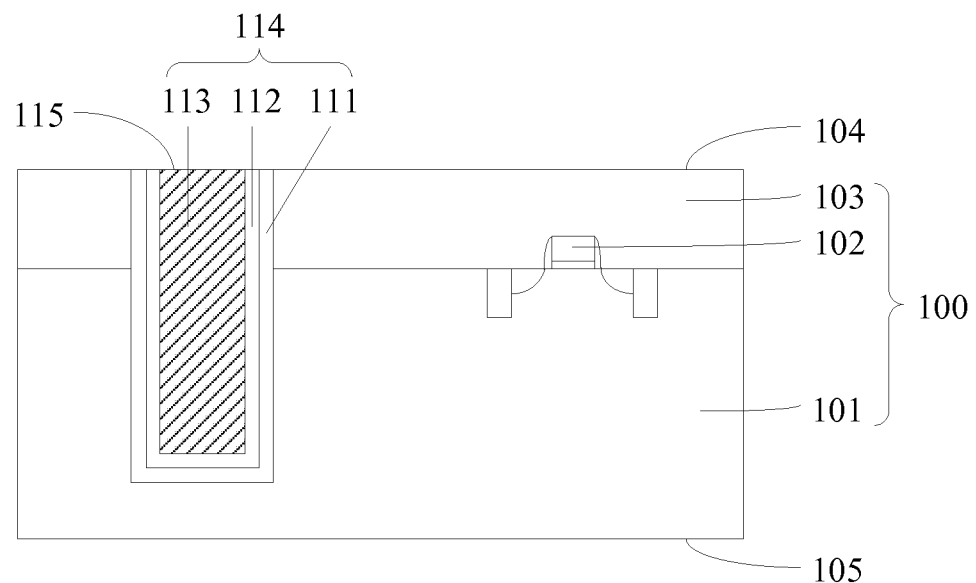

In Step S3 of FIG. 12 and referring to FIG. 3, an insulating layer 111 (or a liner 111) is formed on a sidewall surface and a bottom surface of the opening 110 (e.g., as shown in FIG. 2). A diffusion barrier layer 112 (or a barrier 112) is formed on the insulating layer 111. A metal material layer 113 (or a metal material 113) is formed on the surface of the diffusion barrier layer 112 and fills in the opening 110. The insulating layer 111, the diffusion barrier layer 112 and the metal material layer 113 can constitute a TSV structure 114.

In one embodiment, the insulating layer 111 can be made of a material including silicon oxide. The insulating layer 111 can be used to electrically isolate the metal material layer 113 of the TSV structure 114 from the semiconductor chip 100 and the semiconductor device 102 in the semiconductor chip 100.

In one embodiment, the metal material layer 113 can be made of a material including copper. Because such metal material (e.g., copper) has great diffusion capabilities, a diffusion process may be used subsequently to diffuse the exemplary copper atoms into a tunneling dielectric layer. On the other hand, in order to prevent copper from diffusing into the semiconductor chip 100 to cause unnecessary electrical short-circuits, the diffusion barrier layer 112 can be formed between the insulating layer 111 and the metal material layer 113 to prevent the copper from diffusing into the semiconductor chip 100. In addition, the diffusion barrier layer 112 can increase adhesion between the metal material layer 113 (e.g., the copper of the TSV structure 114) in the opening 110 and the inner sidewalls of the insulating layer 111 in the opening 110. The diffusion barrier layer 112 can be made of a material including titanium nitride, tantalum nitride, other suitable nitride(s), tantalum silicon nitride, tantalum, and/or titanium.

For example, the TSV structure 114 can be formed by the following steps. First, an insulating material layer (not shown) is formed in the opening 110. A diffusion barrier material layer (not shown) is formed on a surface of the insulating material layer. A metal material filler layer (or a metal material layer) is formed on a surface of the diffusion barrier material layer, and fills the opening 110. Next, using the surface of the semiconductor chip 100 (e.g., the first surface 104) as a polishing stop layer, the insulating material layer, the diffusion barrier material layer and the metal filler material layer are polished (e.g., by a chemical mechanical polishing process) until the first surface 104 of the semiconductor chip 100 is exposed. The TSV structure 114 can thus be formed in the opening 110.

In one embodiment, a surface of the TSV structure 114 corresponding to the first surface 104 of the semiconductor chip 100 can serve as a first surface (e.g., the first surface 115 as shown in FIG. 3) of the TSV structure 114. A surface of the TSV structure 114 that is exposed by a subsequent thinning process from the second surface 105 of the semiconductor chip 100 can serve as a second surface of the TSV structure 114. A tunneling dielectric layer and a first electrode can subsequently be formed on the first surface 115 of the TSV structure 114.

In another embodiment, the surface of the TSV structure 114 corresponding to the first surface 104 of the semiconductor chip 100 can serve as the second surface of the TSV structure 114. The surface of the TSV structure 114 that is exposed by subsequent thinning of the second surface 105 of the semiconductor chip 100 can serve as the first surface of the TSV structure 114. The tunneling dielectric layer and the first electrode can subsequently be formed on the first surface of the TSV structure 114.

Figure 4:
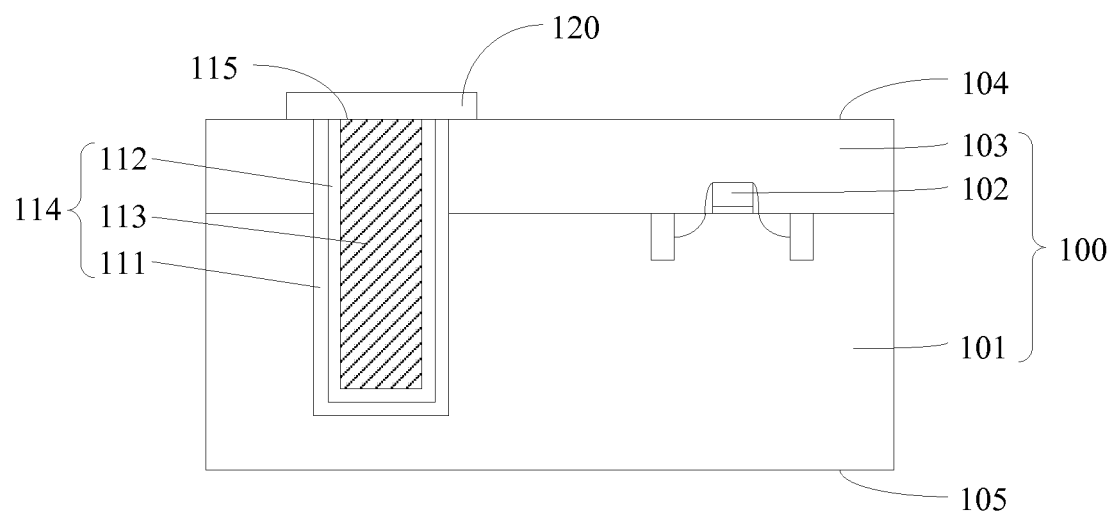

In Step S4 of FIG. 12 and referring to FIG. 4, a tunneling dielectric layer 120 is formed on the first surface 115 of the TSV structure 114. In various embodiments, a surface area parallel to the surface of the semiconductor substrate of the tunneling dielectric layer 120 can be larger than a top view surface area of the TSV structure 114. Thus, the tunneling dielectric layer 120 can also cover a portion of the surface of the semiconductor chip 100 surrounding the TSV structure 114.

The tunneling dielectric layer 120 can be made of a material including insulating materials, e.g., silicon oxide, silicon oxynitride, etc. A process for forming the tunneling dielectric layer 120 can include, for example, a chemical vapor deposition (CVD) process, a tetraethyl orthosilicate (TEOS) process and/or other suitable processes. The CVD process can include a plasma-enhanced chemical vapor deposition (PECVD) process, a low-pressure chemical vapor deposition (LPCVD) process, and/or other suitable processes. When an electrostatic voltage is not applied, the tunneling dielectric layer 120 can be used to electrically isolate the TSV structure 114 from a subsequently-formed first electrode.

In one embodiment, the tunneling dielectric layer 120 can be made of a material including silicon oxynitride, i.e., $Si_XO_YN_Z$. For example, X can be about 1, Y can range from about 0.1 to about 2, and Z can range from about 0.05 to about 1.3. In one embodiment, a ratio of X:Y:Z can be about 1:0.42:0.39. In another embodiment, the ratio of X:Y:Z can be about 1:1.93:0.08. In one embodiment, a thickness of the tunneling dielectric layer 120 can range from about 10 nm to about 100 nm. Thus, the metal material (e.g., the copper in the metal material layer 113) in the TSV structure 114 can substantially diffuse into various locations in the tunneling dielectric layer 120.

The surface area of the tunneling dielectric layer 120 is larger than the top view surface area of the TSV structure 114, and the tunneling dielectric layer 120 can be formed between the first surface 115 of the TSV structure 114 and the subsequently-formed first electrode for electrical isolation. When ESD does not occur, electrical isolation can be maintained between the TSV structure 114 and the first electrode. Meanwhile, the portion (or region) of the semiconductor chip 100 surrounding the TSV structure 114 can be used as an isolation region. Due to stress generated by thermal expansion mismatch between the TSV structure 114 and the semiconductor chip 100, crystal lattice of the isolation region (e.g., of the semiconductor chip 100) may be deformed. Thus, crystal lattice of a portion of the tunneling dielectric layer 120 at the isolation region of the semiconductor chip 100 can also be deformed, which can enhance the diffusion of copper atoms into the tunneling dielectric layer 120.

Figure 5:
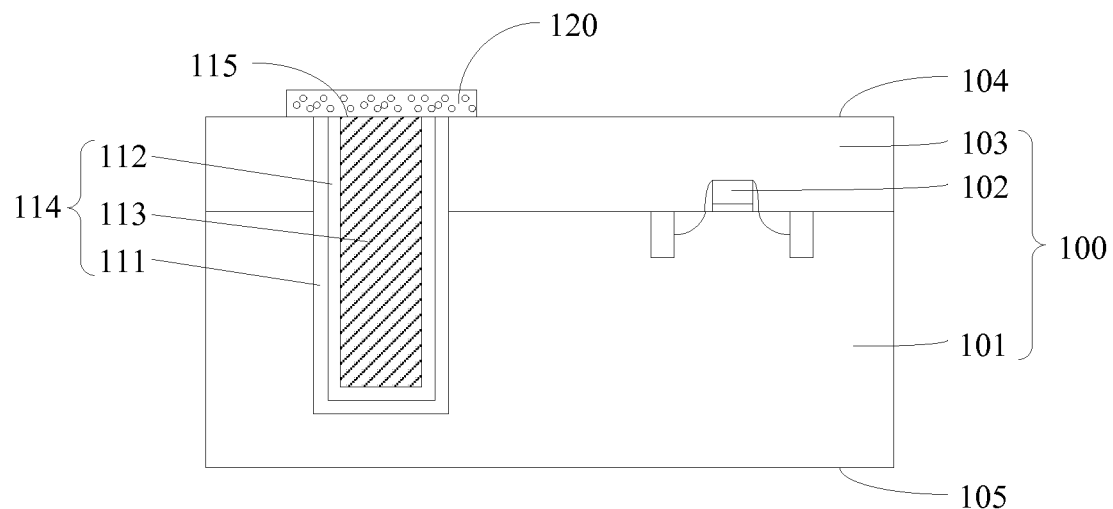

In Step S5 of FIG. 12 and referring to FIG. 5, using an annealing process, the metal material in the metal material layer 113 in the TSV structure 114 diffuses into the tunneling dielectric layer 120. For example, the diffused metal material in the metal material layer 113 can be copper atoms or copper ions.

In one embodiment, the annealing process can include a low-temperature annealing process. For example, an annealing temperature can range from about 50° C. to about 400° C. An annealing time can range from about 30 seconds to about 600 seconds. The annealing process can pre-diffuse to disperse the copper atoms into the tunneling dielectric layer 120. The copper atoms can then be trapped by oxygen and/or nitrogen atoms in the tunneling dielectric layer 120. After the annealing process, the copper atoms in the TSV structure 114 can be diffused to various locations of the tunneling dielectric layer 120, such that the copper atoms can be discretely dispersed in the tunneling dielectric layer 120.

Figure 6:
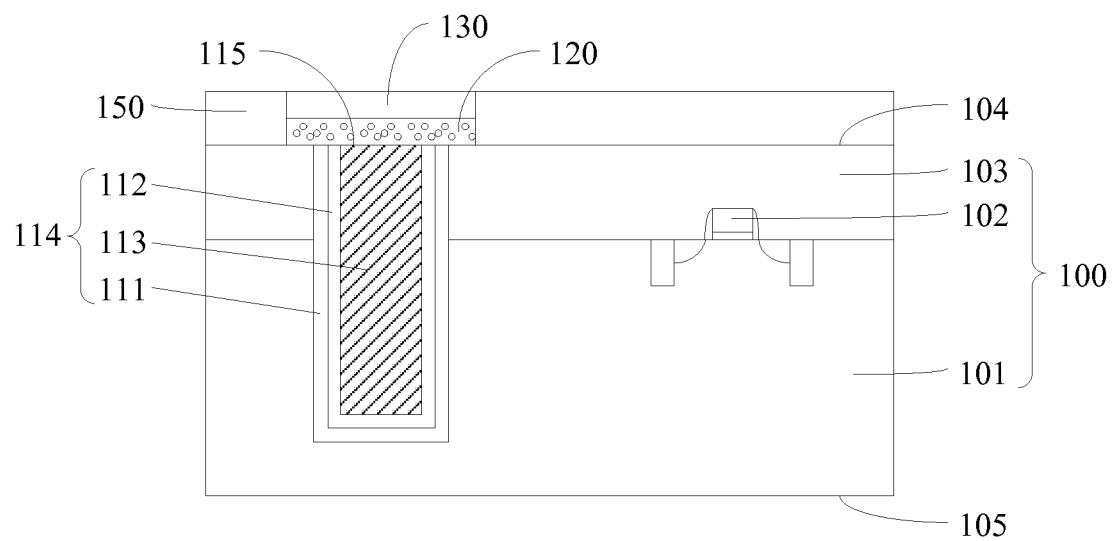

In Step S6 of FIG. 12 and referring to FIG. 6, optionally, the first surface 104 of the semiconductor chip 100 is covered by a passivation layer 150. A first electrode 130 is formed on the tunneling dielectric layer 120.

The passivation layer 150 can be made of a material including silicon oxide, silicon oxynitride, silicon nitride, resin material(s), etc. The passivation layer 150 can be used to protect the semiconductor chip 100. In various embodiments, the passivation layer 150 can expose a surface of the dielectric tunneling the layer 120.

In one embodiment, the first electrode 130 can be on one side of the first surface 104 of the semiconductor chip 100. The first electrode 130 can be made of a material including, e.g., polycrystalline silicon, tungsten, copper, and/or aluminum. After the first electrode 130 is formed, the first electrode 130 can be electrically connected to the metal interconnect structure (not shown) in the interlayer dielectric layer 103.

In one embodiment, the annealing process (e.g., as depicted in Step S5 of FIG. 12) can be performed before forming the first electrode. In another embodiment, the annealing process can be performed after forming the first electrode, which is not limited by the present disclosure.

Figure 7:
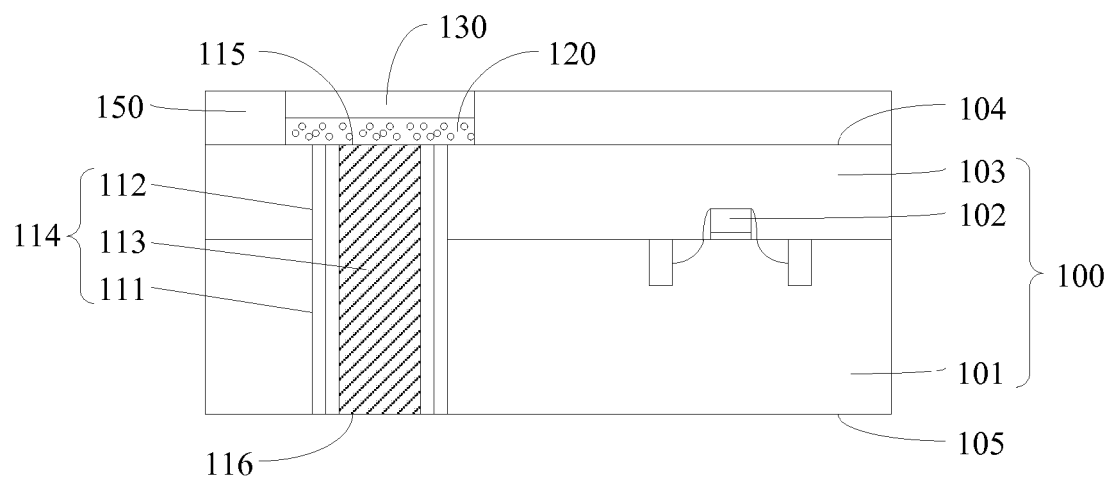

In Step S7 of FIG. 12 and referring to FIG. 7, a thinning process can be performed on the second surface 105 of the semiconductor chip 100, until a second surface 116 of the TSV structure 114 is exposed. After this thinning process, the opening 110 in FIGS. 1-6 becomes a through hole passing through the thinned semiconductor chip 100 as shown in FIG. 7. Thus, the TSV structure 114 can pass through the second surface 105 of the semiconductor chip 100 after the thinning process. The thinning process can include, e.g., a mechanical thinning process and/or a chemical mechanical polishing process.

Figure 8:
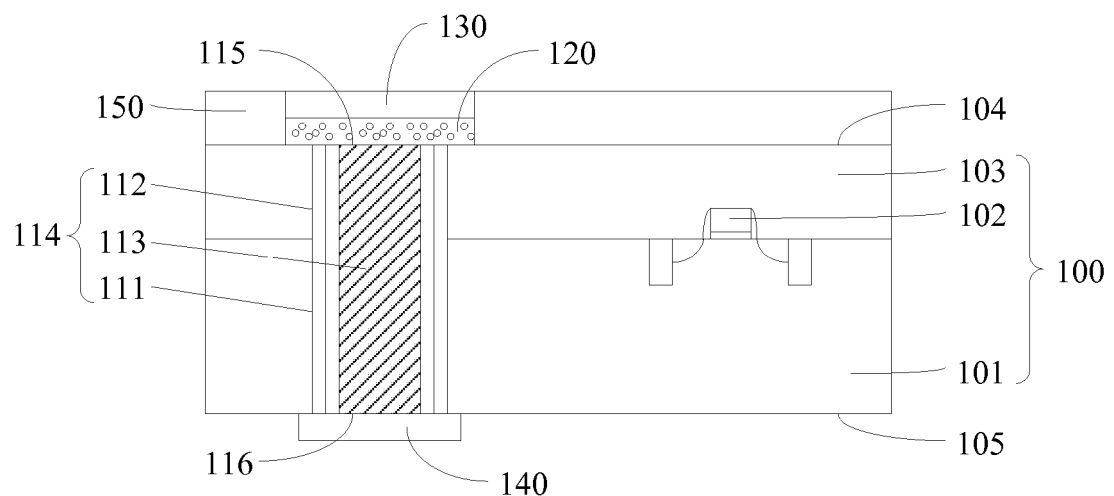

In Step S8 of FIG. 12 and referring to FIG. 8, a second electrode 140 can be formed on the second surface 116 of structure of the TSV structure 114. The second electrode 140 can be made of a material including, e.g., polycrystalline silicon, tungsten, copper, and/or aluminum. The second electrode 140 and the first electrode 130 can be made of the same material or different materials, without limitation.

In one embodiment, a bottom redistribution layer can be formed on the second electrode 140 and on the second surface 105 of the semiconductor chip 100. Using the bottom redistribution layer, bonding pad(s) on the second surface 105 of the semiconductor chip 100 can be redistributed such that a position of the bonding pad(s) of the semiconductor chip 100 can correspond to a position of bonding pad(s) on another chip. This can facilitate electrical connections between stacked chips including the semiconductor chip 100 and the another chip.

In some embodiments, the first electrode 130 can be electrically connected to an ESD input terminal (e.g., a pad). The second electrode 140 can be electrically connected to a power supply terminal Vdd or a ground terminal Vss. In other embodiments, the second electrode 140 can be electrically connected to the ESD input terminal. The first electrode 130 can be electrically connected to the power supply terminal Vdd or the ground terminal Vss.

In one embodiment, the first surface of the TSV structure 114 can correspond to the second surface 105 of the semiconductor chip 100. The second surface of the TSV structure 114 can correspond to the first surface 104 of the semiconductor chip 100.

In this case, the opening 110 can be formed through the interlayer dielectric layer 103 and into a thickness portion of the semiconductor substrate 101. The TSV structure 114 can be formed in the opening 110. The thinning process can be performed on the second surface 105 of the semiconductor chip 100, until the TSV structure 114 is exposed. The TSV structure 114 can have the first surface and the second surface. The tunneling dielectric layer can then be formed on the first surface of the TSV structure 114. The first electrode can be formed on the tunneling dielectric layer. The second electrode can be formed on the second surface of the TSV structure 114.

In this case, the first electrode can be electrically connected to the ESD input terminal, and the second electrode can be electrically connected to the power supply terminal Vdd or a ground terminal Vss. Alternatively, for example, the second electrode may be electrically connected to the ESD input terminal, and the first electrode can be electrically connected to the power supply terminal Vdd or the ground terminal Vss.

In accordance with various disclosed embodiments, an ESD protection structure is provided. The ESD protection structure can also be referred to as a TSV-ESD element, or a TSV ESD structure. FIG. 8 depicts a cross-sectional view of an exemplary ESD protection structure in accordance with various disclosed embodiments. Referring to FIG. 8, the exemplary ESD protection structure can include a semiconductor chip 100 and a TSV structure 114 passing through the semiconductor chip 100.

The TSV structure 114 can include a first surface 115 and a second surface 116. The ESD protection structure can further include a tunneling dielectric layer 120 on the first surface 115 of the TSV structure 114. A surface area (parallel to the surface of the substrate 101) of the tunneling dielectric layer 120 can be greater than a top view surface area of the TSV structure 114, so the tunneling dielectric layer 120 can cover a portion of the surface of the semiconductor chip 100 surrounding the TSV structure 114.

Figure 9:
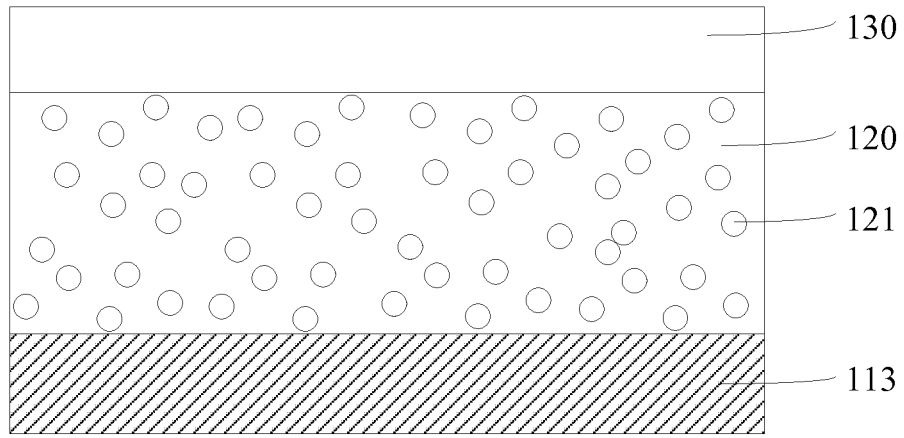
FIGS. 9-10 depict partially-enlarged views of a tunneling dielectric layer in accordance with various disclosed embodiments.

Further, the ESD protection structure can include a metal material 121 (e.g., as shown in FIG. 9) discretely dispersed in the tunneling dielectric layer 120, a first electrode 130 on a surface of the tunneling dielectric layer 120, and a second electrode 140 on the second surface 116 of the TSV structure 114.

The tunneling dielectric layer 120 can be made of a material including insulating materials, e.g., silicon oxide, silicon oxynitride, etc. A thickness of the tunneling dielectric layer 120 can range from about 10 nm to about 100 nm. Thus, the metal material 121 can substantially diffuse into various locations in the tunneling dielectric layer 120 (e.g., metal atoms/ions in a metal material layer 113 in the TSV structure 114 can diffuse into the tunneling dielectric layer 120 to become the metal material 121). When an electrostatic voltage is not applied, the tunneling dielectric layer 120 can be insulative. When the electrostatic voltage is applied on both ends of the tunneling dielectric layer 120, the tunneling dielectric layer 120 can be conductive.

Figure 10:
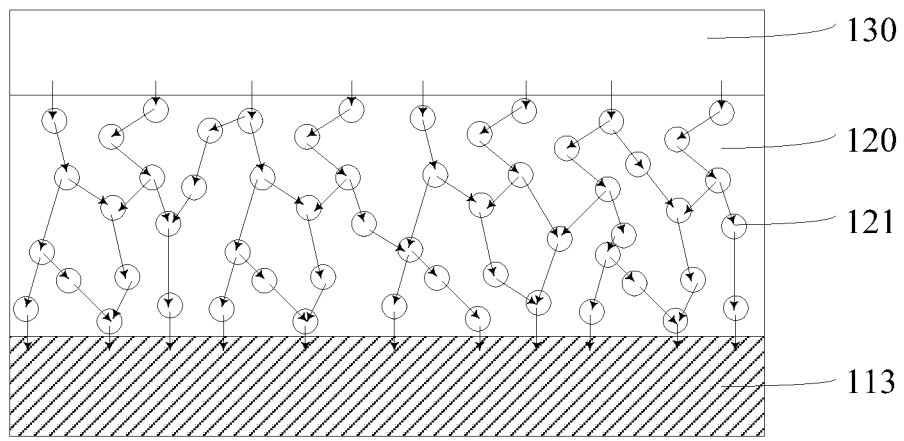

FIGS. 9-10 depict partially-enlarged views of a tunneling dielectric layer in accordance with various disclosed embodiments. Referring to FIG. 9, after the annealing process (e.g. as in Step S5 of FIG. 12), the metal material 121 (e.g., copper atoms, or copper ions) can be discretely dispersed in the tunneling dielectric layer 120 in a manner that a certain distance can be maintained between the copper atoms/ions such that the tunneling dielectric layer 120 can remain insulative when no electrostatic voltage is applied. Note that under normal operating voltage (e.g., usually not exceeding about 10 volts), both sides of the tunneling dielectric layer 120 are not electrically connected.

Referring to FIG. 10, when there is an electrostatic voltage applied at the ESD input terminal, the ESD voltage can be high, e.g., typically reaching hundreds or thousands of volts. Since the metal material 121 (e.g., the copper atoms) can be discretely dispersed in the tunneling dielectric layer 120, the distance between adjacent copper atoms 121 can be much less than a thickness of the tunneling dielectric layer 120, so a tunneling effect tends to take place between the copper atoms 121 in the tunneling dielectric layer 120.

For example, the tunneling effect can take place between any adjacent copper atoms 121, so both sides of the tunneling dielectric layer 120 can be electrically connected. Thus, the tunneling dielectric layer 120 can be conductive and the TSV structure 114 can be used for ESD. Since the TSV structure 114 can often have a large top view surface area (e.g., a large diameter or width), ESD current may not be great enough to burn and destroy the ESD protection structure. When the electrostatic current (i.e., the ESD current) is released completely, the electrostatic voltage can become low, the tunneling effect can disappear, and the both sides of the tunneling dielectric layer 120 can be electrically isolated again.

Figure 11:
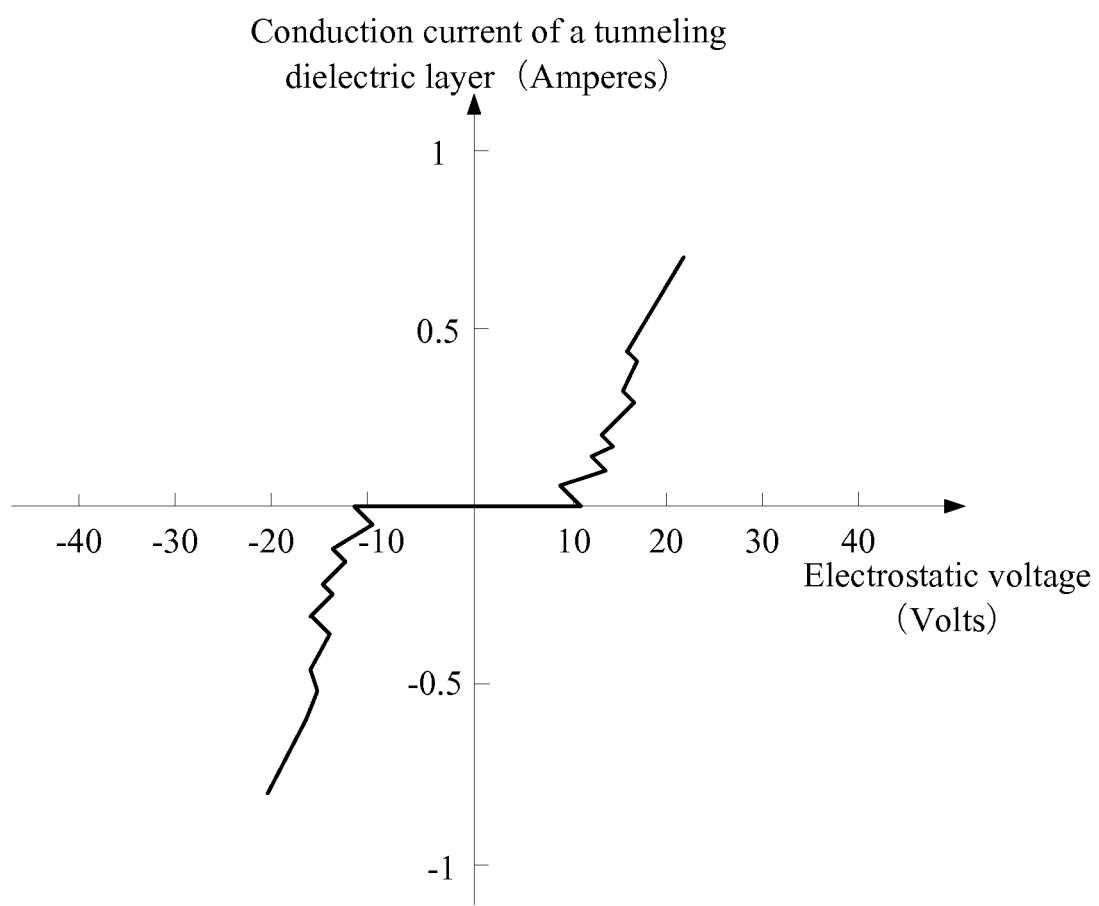
FIG. 11 depicts a conduction current of a tunneling dielectric layer as a function of an electrostatic voltage in accordance with various disclosed embodiments.

FIG. 11 depicts a conduction current of a tunneling dielectric layer as a function of an electrostatic voltage (i.e., current/voltage (I/V) characteristics) in accordance with various disclosed embodiments. The horizontal axis in FIG. 11 indicates the electrostatic voltage. The vertical axis in FIG. 11 indicates the conduction current (e.g., the ESD current, or the on-current) of the tunneling dielectric layer (e.g., the tunneling dielectric layer 120). As shown in FIG. 11, when the electrostatic voltage is less than about 10 volts, the on-current can be about 0 A, and the tunneling dielectric layer 120 can be electrically insulative. When the electrostatic voltage is greater than about 0 volts and gradually increases, the on-current of the tunneling dielectric layer 120 can gradually increase. The conduction current can be used to release electrostatic charge, thus reducing the electrostatic voltage and achieving ESD protection.

In some embodiments, the first surface 115 of the TSV structure 114 can correspond to a first surface 104 of the semiconductor chip 100 having a semiconductor device 102. The second surface 116 of the TSV structure 114 can correspond to a second surface 105 of the semiconductor chip 100 not having the semiconductor device 102. The tunneling dielectric layer 120 can be formed on the first surface 115 of the TSV structure 114.

In other embodiments, the first surface of the TSV structure 114 can correspond to the second surface 105 of the semiconductor chip 100. The second surface of the TSV structure 114 can correspond to the first surface 104 of the semiconductor chip 100. The tunneling dielectric layer 120 can be formed on the first surface of the TSV structure 114.

In some embodiments, the first electrode 130 can be electrically connected to an ESD input terminal. The second electrode 140 can be electrically connected to a power supply terminal Vdd or a ground terminal Vss. In other embodiments, the second electrode 140 can be electrically connected to the ESD input terminal. The first electrode 130 can be electrically connected to the power supply terminal Vdd or the ground terminal Vss.

In this manner, various disclosed embodiments provide an ESD protection structure. A tunneling dielectric layer can be formed on a first surface of a TSV structure and on a portion of a surface of the semiconductor chip surrounding the TSV structure. A metal material layer can fill the TSV structure, so the metal material can diffuse into the tunneling dielectric layer by an annealing process. Because the tunneling dielectric layer can be formed on the first surface of the TSV structure and on the surface of a portion of the semiconductor chip surrounding the TSV structure, i.e., formed in an isolation region, the tunneling dielectric layer can have its crystal lattice stretched under stress. This lattice stretch can facilitate diffusion of the metal material such that the metal material can be discretely dispersed in the tunneling dielectric layer.

When an ESD has not occurred, a first electrode and a second electrode of the TSV structure can be electrically isolated by the tunneling dielectric layer. During an ESD, due to a high electrostatic voltage, a tunneling effect can occur between the metal material discretely dispersed in the tunneling dielectric layer, such that there can be electrical conduction (turn-on) between the first electrode and the second electrode, and ESD can occur through the TSV structure.

The TSV structure can have a diameter or width sufficiently large that allows the ESD not to burn or destroy the ESD protection structure. In addition, the ESD protection structure can be formed in the isolation region of the TSV structure, so the area of the isolation region can be effectively used. Further, no additional ESD protection structures need to be formed in other regions of a chip. Chip area utilization can be improved.

The embodiments disclosed herein are exemplary only. Other applications, advantages, alternations, modifications, or equivalents to the disclosed embodiments are obvious to those skilled in the art and are intended to be encompassed within the scope of the present disclosure.

What is claimed is:

1. An electrostatic discharge (ESD) protection structure, comprising:
   a semiconductor chip including a first surface adjacent to a semiconductor device disposed within the semiconductor chip, and a second surface opposite to the first surface, wherein the semiconductor chip includes a through hole;
   a through silicon via (TSV) structure disposed within the through hole and passing through the semiconductor chip, wherein the TSV structure has a first surface coplanar with the first surface of the semiconductor chip, and a second surface coplanar with the second surface of the semiconductor chip;
   a tunneling dielectric layer containing a metal material discretely dispersed therein, wherein the tunneling dielectric layer is in direct contact with an entire area of the first surface of the TSV structure and also in direct contact with a surface portion of the first surface adjacent to the semiconductor device of the semiconductor chip surrounding the TSV structure, wherein the metal material discretely dispersed in the tunneling dielectric layer is diffused from a metal material layer in the underlying TSV structure;
   a first electrode disposed on the tunneling dielectric layer; and
   a second electrode disposed on the second surface of the TSV structure.

2. The structure of claim 1, wherein the tunneling dielectric layer is made of a material including silicon oxide, silicon oxynitride, or a combination thereof.

3. The structure of claim 1, wherein the tunneling dielectric layer has a thickness ranging from about 10 nm to about 100 nm.

4. The structure of claim 1, wherein the TSV structure includes:

an insulating layer disposed on inner sidewalls of the through hole;
a diffusion barrier layer disposed on the insulating layer; and
the metal material layer disposed on the diffusion barrier layer and filling the through hole.

5. The structure of claim 1, wherein the metal material layer is made of a material including copper.

6. The structure of claim 1, wherein the first electrode and the second electrode are made of a material including polycrystalline silicon, tungsten, copper, aluminum, or a combination thereof.

7. A method for forming an ESD protection structure, comprising:
providing a semiconductor chip including a semiconductor device disposed on a semiconductor substrate, and an interlayer dielectric layer disposed on the semiconductor device and the semiconductor substrate, wherein the semiconductor chip includes a first surface of the interlayer dielectric layer adjacent to the semiconductor device, and a second surface of the semiconductor substrate opposite to the first surface;
forming an opening through the interlayer dielectric layer and into a thickness portion of the semiconductor substrate;
forming a TSV structure in the opening, wherein the TSV structure contains a metal material layer;
performing a thinning process on the second surface of the semiconductor chip until the TSV structure is exposed, wherein the exposed TSV structure has a first surface coplanar with the first surface of the interlayer dielectric layer of semiconductor chip and a second surface coplanar with the second surface of the semiconductor substrate of semiconductor chip;
forming a tunneling dielectric layer on the first surface of the TSV structure such that the tunneling dielectric layer is in direct contact with an entire area of the first surface of the TSV structure and also in direct contact with a surface portion of the first surface of the semiconductor chip surrounding the TSV structure;
diffusing a metal material from the metal material layer of the underlying TSV structure into the tunneling dielectric layer using an annealing process such that the metal material is discretely dispersed in the tunneling dielectric layer;
forming a first electrode on the tunneling dielectric layer; and
forming a second electrode on the second surface of the TSV structure.

8. The method of claim 7, wherein the tunneling dielectric layer is made of a material including silicon oxide, silicon oxynitride, or a combination thereof.

9. The method of claim 7, wherein the tunneling dielectric layer is formed by a process including a chemical vapor deposition (CVD) process, a tetraethyl orthosilicate (TEOS) process, or a combination thereof.

10. The method of claim 7, wherein the annealing process includes a low-temperature annealing process having an annealing temperature ranging from about 50° C. to about 400° C. and an annealing time ranging from about 30 seconds to about 600 seconds.

11. The method of claim 7, wherein the tunneling dielectric layer has a thickness ranging from about 10 nm to about 100 nm.

12. The method of claim 7, wherein the forming of the TSV structure includes:
forming an insulating layer on inner sidewalls of the opening;
forming a diffusion barrier layer on the insulating layer; and
forming the metal material layer on the diffusion barrier layer to fill the opening.

13. The method of claim 7, wherein the metal material layer is made of a material including copper.

14. The method of claim 7, wherein the first electrode and the second electrode are made of a material including polycrystalline silicon, tungsten, copper, aluminum, or a combination thereof.

15. The structure of claim 1, wherein the semiconductor chip including the semiconductor device disposed on a semiconductor substrate, and an interlayer dielectric layer disposed directly on the semiconductor device and on the semiconductor substrate, wherein the semiconductor chip includes the first surface of the interlayer dielectric layer adjacent to the semiconductor device, and the second surface of the semiconductor substrate opposite to the first surface.

16. The structure of claim 1, wherein a passive layer is formed on the first surface of the semiconductor chip surrounding a stack of the tunneling dielectric layer and the first electrode, and the passive layer has a top surface coplanar with a top surface of the first electrode.

17. The method of claim 7, further comprising forming a passive layer on the first surface of the semiconductor chip surrounding a stack including the tunneling dielectric layer and the first electrode, wherein the passive layer has a top surface coplanar with a top surface of the first electrode.

* * * * *